(12) United States Patent
Zhao et al.

(10) Patent No.: US 11,323,074 B2
(45) Date of Patent: May 3, 2022

(54) RADIO FREQUENCY POWER AMPLIFIER BASED ON POWER DETECTION FEEDBACK, CHIP AND COMMUNICATION TERMINAL

(71) Applicant: VANCHIP (TIANJIN) TECHNOLOGY CO., LTD., Tianjin (CN)

(72) Inventors: Jinxin Zhao, Tianjin (CN); Yunfang Bai, Tianjin (CN)

(73) Assignee: VANCHIP (TIANJIN) TECHNOLOGY CO., LTD., Tianjin (CN)

( * ) Notice: Subject to any disclaimer, the term of this patent is extended or adjusted under 35 U.S.C. 154(b) by 314 days.

(21) Appl. No.: 16/628,243

(22) PCT Filed: Jun. 30, 2018

(86) PCT No.: PCT/CN2018/093936
§ 371 (c)(1),
(2) Date: Jan. 2, 2020

(87) PCT Pub. No.: WO2019/007294
PCT Pub. Date: Jan. 10, 2019

(65) Prior Publication Data
US 2020/0220504 A1 Jul. 9, 2020

(30) Foreign Application Priority Data

Jul. 5, 2017 (CN) .......................... 201710543153.4

(51) Int. Cl.
*H03F 1/30* (2006.01)
*H03F 3/213* (2006.01)
*H04B 1/40* (2015.01)

(52) U.S. Cl.
CPC ............... *H03F 1/30* (2013.01); *H03F 3/213* (2013.01); *H03F 2200/447* (2013.01); *H03F 2200/451* (2013.01); *H04B 1/40* (2013.01)

(58) Field of Classification Search
CPC ...................................................... H03F 1/30
See application file for complete search history.

(56) References Cited

U.S. PATENT DOCUMENTS

| 4,333,059 A | 6/1982 | Yamaguchi et al. |
| 9,595,926 B2 | 3/2017 | Quaglietta |
| (Continued) | | |

FOREIGN PATENT DOCUMENTS

| CN | 101656511 | 2/2010 |
| CN | 102624344 A | 8/2012 |
| (Continued) | | |

OTHER PUBLICATIONS

International Search Report in the international application No. PCT/CN2018/093936, dated Sep. 26, 2018.
(Continued)

*Primary Examiner* — Patricia T Nguyen
(74) *Attorney, Agent, or Firm* — Ladas & Parry, LLP

(57) ABSTRACT

Disclosed in the present invention are a radio frequency power amplifier based on power detection feedback, a chip, and a communication terminal. The radio frequency power amplifier comprises multiple stages of amplifier circuits and at least one power detection feedback circuit; the input end of the power detection feedback circuit is connected to the output end of a current stage of amplifier circuit, and the output end of the power detection feedback circuit is connected to the input ends of the current stage of amplifier circuit and at least one stage of amplifier circuit located prior to the current stage of amplifier circuit. The power detection feedback circuit generates, according to the detected output
(Continued)

power of the current stage of amplifier circuit, a control voltage varying inversely with the output power, so that the power detection feedback circuit outputs current varying positively with the control voltage.

14 Claims, 5 Drawing Sheets

(56) References Cited

U.S. PATENT DOCUMENTS

| | | | | |
|---|---|---|---|---|
| 2004/0072554 A1* | 4/2004 | Henderson | ........... | H03G 3/3042 455/341 |
| 2005/0225394 A1* | 10/2005 | Doherty | ................. | H03F 3/211 330/285 |
| 2007/0008038 A1 | 1/2007 | Klepser et al. | | |
| 2007/0153937 A1* | 7/2007 | Itkin | .................... | H03G 3/3042 375/297 |
| 2008/0231368 A1 | 9/2008 | Suzaki et al. | | |
| 2014/0191807 A1* | 7/2014 | Qin | ...................... | H03F 1/0261 330/296 |
| 2014/0266451 A1* | 9/2014 | Scott | ....................... | H03F 3/211 330/278 |
| 2014/0333382 A1 | 11/2014 | Lautzenhiser | | |
| 2020/0099340 A1* | 3/2020 | Sharma | ................... | H03F 3/193 |

FOREIGN PATENT DOCUMENTS

| | | |
|---|---|---|
| CN | 203261299 U | 10/2013 |
| CN | 103457550 A | 12/2013 |
| CN | 104641553 A | 5/2015 |
| CN | 106100590 A | 11/2016 |
| CN | 106788285 A | 5/2017 |
| CN | 107395144 A | 11/2017 |
| WO | 2014160807 A1 | 10/2014 |

OTHER PUBLICATIONS

Written Opinion of the International Searching Authority in the international application No. PCT/CN2018/093936, dated Sep. 26, 2018 with English translation provided by Google Translate.
First Office Action and Search Report from CN app. No. 201710543153. 4, dated Mar. 8, 2019, with English translation from Global Dossier.
Notice of Allowance from CN app. No. 201710543153.4, dated Dec. 4, 2019, with English translation from Global Dossier.
Extended European Search Report from EP app. No. 18828768.4, dated Mar. 5, 2021.
Written Opinion of the International Searching Authority from PCT/CN2018/093936, dated Sep. 26, 2018, with English translation from WIPO.
International Preliminary Report on Patentability from PCT/CN2018/ 093936, dated Jan. 7, 2020, with English translation from WIPO.

* cited by examiner

RADIO FREQUENCY POWER AMPLIFIER BASED ON POWER DETECTION FEEDBACK, CHIP AND COMMUNICATION TERMINAL

CROSS-REFERENCE TO RELATED APPLICATIONS

This application is a national phase application of International Patent Application No. PCT/CN2018/093936, filed on Jun. 30, 2018, which claims priority to Chinese Application No. 201710543153.4, filed on Jul. 5, 2017, the contents of which are hereby incorporated by reference in their entireties.

BACKGROUND

Technical Field

The present invention relates to a radio frequency power amplifier, in particular to a radio frequency power amplifier based on power detection feedback, also relates to a chip including the radio frequency power amplifier and a corresponding communication terminal, and belongs to the technical field of radio frequency integrated circuits.

Related Art

At present, the development of wireless communication greatly satisfies the requirements of people on communication, and those requirements further drive wireless communication terminals to fast increase all over the world. A radio power amplifier is a necessary function module in the wireless communication terminal, and has a main effect of amplifying the emission power of the communication terminal so as to still maintain a sufficient signal intensity when a signal reaches a base station, so that the lowest signal-to-noise ratio required for communication is realized, and the signal sending and receiving operation of a whole communication link is completed.

In a wireless communication system, the main direct current power consumption is from a radio frequency power amplifier, and the operating time of the system can be obviously prolonged by reducing the power consumption of the radio frequency power amplifier. On the other hand, the integral performance of a radio frequency circuit is directly determined by the performance of the radio frequency power amplifier. In addition, the design of the radio frequency power amplifier generally requires stable gain and output power.

However, in realization of the radio frequency power amplifier, due to the influence of factors such as process deviation and temperature variation, the gain and the output power of the radio frequency power amplifier vary in a large range. Meanwhile, by considering that the amplitude of an input signal is influenced by the process deviation and the temperature variation, the variation of the input signal can cause the output power of the radio frequency power amplifier to vary in a larger range. Therefore, feedback control needs to be performed on the quiescent operating current and the output power of the radio frequency power amplifier, so that the operating state variation of the radio frequency power amplifier caused by process variation is inhibited, the influence of variation of the input signal on the operating state of the radio frequency power amplifier can be reduced, so that the radio frequency power amplifier operates in a state in which the gain and the output power are stable.

SUMMARY

The primary technical problem to be solved by the present invention is to provide a radio frequency power amplifier based on power detection feedback.

Another technical problem to be solved by the present invention is to provide a chip including the radio frequency power amplifier and a corresponding communication terminal.

In order to achieve the goals, the present invention adopts the following technical schemes:

According to a first aspect of embodiments of the present invention, a radio frequency power amplifier based on power detection feedback is provided. The radio frequency power amplifier based on power detection feedback includes multiple stages of amplifier circuits and at least one power detection feedback circuit. An input end of the power detection feedback circuit is connected to an output end of a current stage of amplifier circuit in the multiple stages of amplifier circuits. An output end of the power detection feedback circuit is connected to input ends of the current stage of amplifier circuit and at least one stage of amplifier circuit located prior to the current stage of amplifier circuit.

The power detection feedback circuit generates, according to the detected output power of the current stage of amplifier circuit, a control voltage varying inversely with the output power, so that the power detection feedback circuit outputs a current varying positively with the control voltage. The current is input into the input ends of the current stage of amplifier circuit and the at least one stage of amplifier circuit located prior to the current stage of amplifier circuit, and a quiescent operating current of at least one stage of amplifier circuit varies positively with the current, so that the radio frequency power amplifier operates in a state in which the gain and the output power are stable.

Preferably, the radio frequency power amplifier further includes at least one current detection feedback circuit, wherein an input end of the current detection feedback circuit is connected to an input end of a certain stage of amplifier circuit located posterior to the current stage of amplifier circuit through a corresponding resistor. An output end of the current detection feedback circuit is connected to an input end of at least one stage of amplifier circuit located prior to the current stage of amplifier circuit.

The current detection feedback circuit generates, according to a detected quiescent operating current of the current stage of amplifier circuit, a control voltage varying inversely with the quiescent operating current, so that the current detection feedback circuit outputs a current varying positively with the control voltage. The current is input into the input end of the at least one stage of amplifier circuit located prior to the current stage of amplifier circuit, so that the quiescent operating current of at least one stage of amplifier circuit varies positively with the current. The radio frequency power amplifier operates in a state in which the gain and the output power are stable.

Preferably, the power detection feedback circuit includes a first detection circuit and a first feedback circuit, wherein an output end of the first detection circuit is connected to an input end of the first feedback circuit. An input end of the first detection circuit is connected to the output end of the current stage of amplifier circuit. An output end of the first feedback circuit is connected to the input ends of the current stage of amplifier circuit and the at least one stage of amplifier circuit located prior to the current stage of amplifier circuit.

Preferably, the input end of the first feedback circuit is connected to an output end of a second detection circuit. The detected quiescent operating current of the current stage of amplifier circuit is input into the first feedback circuit through the second detection circuit.

Preferably, the current detection feedback circuit includes a second detection circuit and a second feedback circuit, wherein an output end of the second detection circuit is connected to an input end of the second feedback circuit. An input end of the second detection circuit is connected to the input end of the current stage of amplifier circuit. An output end of the second feedback circuit is connected to the input end of the at least one stage of amplifier circuit located prior to the current stage of amplifier circuit.

Preferably, the first detection circuit is formed by connecting a first resistor and a first capacitor in series. The second detection circuit consists of a sixth resistor.

Preferably, the first detection circuit consists of the first capacitor.

Preferably, each of the first feedback circuit and the second feedback circuit includes two transistors, wherein a fourth resistor is arranged between a collector of a first transistor and a power supply voltage. A fifth resistor is arranged between the collector of the first transistor and a base of a second transistor. A collector of the second transistor is connected to the power supply voltage. A base of the first transistor is used as the input end of the feedback circuit. An emitter of the second transistor is used as the output end of the feedback circuit.

Preferably, when the current detection feedback circuit shares the first feedback circuit with the power detection feedback circuit, a bias voltage is respectively provided for the current stage of amplifier circuit and the first transistor through a first basis circuit. The first bias circuit includes a transistor. A collector of the transistor is connected to the bias voltage. An emitter of the transistor is connected to the base of the first transistor through the sixth resistor. The emitter of the transistor is connected to the input end of the current stage of amplifier circuit. A resistor is arranged between the base of the transistor and the bias voltage. Two diodes are connected in series between the base of the transistor and a ground wire.

Preferably, the bias voltage is provided for the first transistor of the power detection feedback circuit through a second bias circuit. The second bias circuit includes a second resistor and a third resistor. One end of the second resistor is connected to the power supply voltage. The other end of the second resistor and one end of the third resistor are connected together to form the output end of the second bias circuit. The other end of the third resistor is grounded.

Preferably, the bias voltage is respectively provided for the first transistor of the current detection feedback circuit and the current stage of amplifier circuit through the first bias circuit.

Preferably, in multiple stages of amplifier circuits, each stage of amplifier circuit is a common emitter amplifier circuit consisting of a bipolar transistor or a CMOS transistor. A load is arranged between each stage of amplifier circuit and the power supply voltage. The load is a resistor or an inductor. A capacitor is arranged between an input end of a posterior stage of amplifier circuit and an output end of a prior stage of amplifier circuit.

According to a second aspect of the embodiments of the present invention, a chip is provided, wherein the chip includes the radio frequency power amplifier based on power detection feedback.

According to a third aspect of the embodiments of the present invention, a communication terminal is provided, wherein the communication terminal includes the radio frequency power amplifier based on power detection feedback.

The radio frequency power amplifier provided by the present invention is used for realizing the detection of the output power of the current stage of amplifier current through arranging the power detection feedback circuit, generating a control voltage varying inversely with the output power according to the detected output power, and enabling the power detection feedback circuit to output current varying positively with the control voltage. The current is input into the input ends of the current stage of amplifier circuit and at least one stage of amplifier circuit located prior to the current stage of amplifier circuit through the power detection feedback circuit, and the quiescent operating currents of the current stage of amplifier circuit and the at least one stage of amplifier circuit located prior to the current stage of amplifier circuit is controlled, so that the radio frequency power amplifier operates in a state in which the gain and the output power are stable.

DETAILED DESCRIPTION

Figure 1:
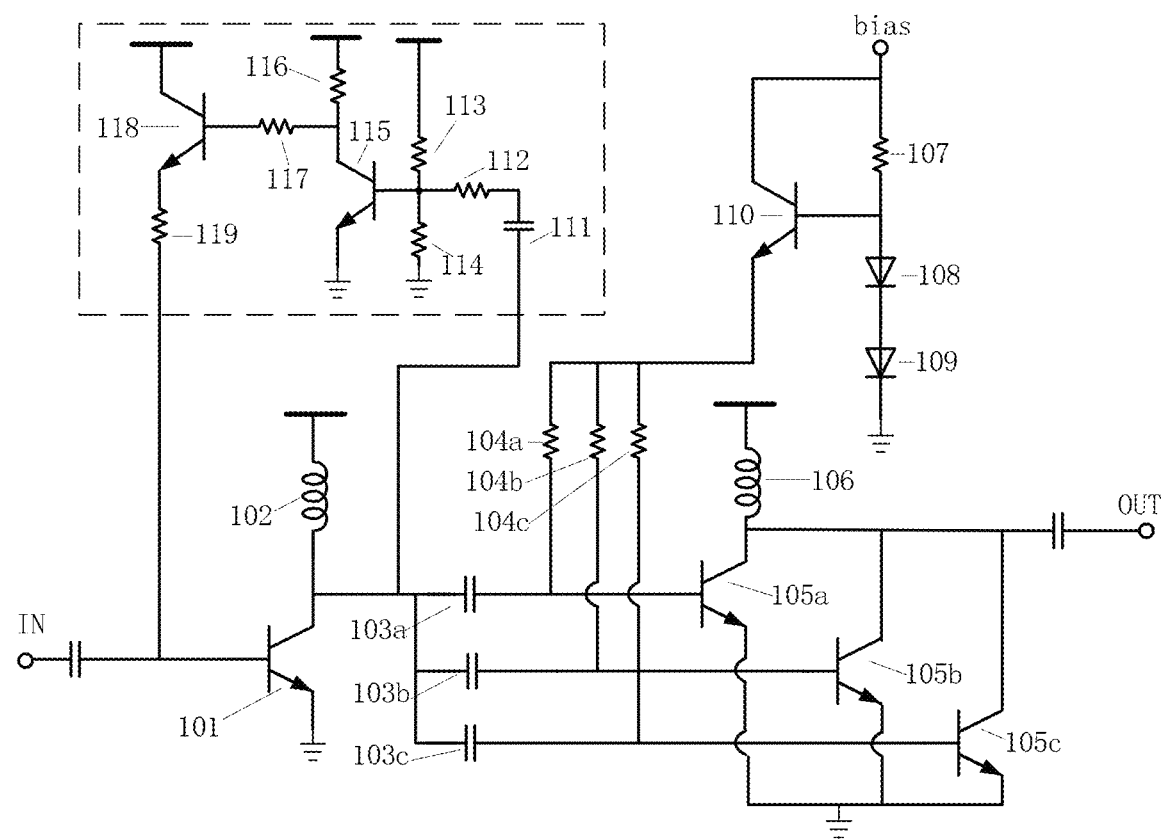
FIG. 1 is a circuit schematic diagram of a radio frequency power amplifier based on power detection feedback provided by Embodiment 1 of the present invention.

The following further describes the technical content of the present disclosure with reference to the accompanying drawings and specific embodiments.

A radio frequency power amplifier provided by the present invention includes multiple stages of amplifier circuits, a first bias circuit and a detection feedback circuit, wherein the multiple stages of amplifier circuits are connected to the first bias circuit, and the first bias circuit provides a bias voltage for the multiple stages of amplifier circuits. The detection feedback circuit includes at least one power detection feedback circuit, or the detection feedback circuit includes at least one power detection feedback circuit and current detection feedback circuit. Each power detection feedback circuit and each current detection feedback current are respectively connected to the multiple stages of amplifier circuits, wherein when the output power of the current stage of amplifier circuit increases or decreases, the output power of the radio frequency power amplifier based on power detection feedback correspondingly increases or decreases. At the moment, the output power of the current stage of amplifier circuit detected by the power detection feedback circuit connected to the current stage of amplifier circuit accordingly increases or decreases, a corresponding current is generated according to the output power, and at the same time, a corresponding control voltage is generated according to the current. The power detection feedback circuit correspondingly decreases or increases the control voltage, so that current output by the power detection feedback circuit correspondingly decreases or increases. The current output by the power detection feedback circuit can be input into the input end of the current stage of amplifier circuit and at least one stage of amplifier circuit located prior to the current stage of amplifier circuit, so that the quiescent operating currents of the current stage of amplifier circuit and the at least one stage of amplifier circuit located prior to the current stage of amplifier circuit correspondingly decrease or increase, and the gain and output power of the current stage of amplifier circuit and the at least one stage of amplifier circuit located prior to the current stage of amplifier circuit correspondingly decrease or increase, so that the problem of gain and output power increase or decrease of the radio frequency power amplifier caused by output power increase or decrease of the current stage of amplifier circuit can be solved, thereby effectively inhibiting the operating state variation of the radio frequency power amplifier caused by the process variation, and reducing the influence on the operating state of the radio frequency power amplifier caused by variation of an input signal, so that the radio frequency power amplifier operates in a state in which the gain and the output power are stable.

When a quiescent operating current of an input end of a certain stage of amplifier circuit located posterior to the current stage of amplifier circuit increases or decreases for certain reasons (such as variation of the production process), the gain of the radio frequency power amplifier based on power detection feedback correspondingly increases or decreases. At the moment, the quiescent operating current of the input end of the certain stage of amplifier circuit detected and copied by the current detection feedback circuit connected to the certain stage of amplifier circuit accordingly increases or decreases, the control voltage generated by the current detection feedback circuit according to the increased or decreased quiescent operating current correspondingly decreases or increases, and the current output by the current detection feedback circuit correspondingly decreases or increases through the decreased or increased control voltage. The current output by the current detection feedback circuit is input into the input end of at least one stage of amplifier circuit located prior to the certain stage of amplifier circuit, so that the quiescent operating current of the input end of the at least one stage of amplifier circuit located prior to the certain stage of amplifier circuit accordingly decreases or increases, the gain of at least one stage of amplifier circuit located prior to the certain stage of amplifier circuit accordingly increases or decreases, thereby solving the problem of gain increase or decrease of the radio frequency power amplifier based on power detection feedback caused by an increase or decrease in the quiescent operating current of the certain stage of amplifier circuit, and ensuring the total gain constancy of the radio frequency power amplifier based on power detection feedback.

In the radio frequency power amplifier provided by the present invention, the position relationship between each stage of amplifier circuit in the multiple stages of amplifier circuits uses the current flowing direction of the multiple stages of amplifier circuits as a reference, namely the front and back position relationships mentioned in various parts in the present invention all use the current flowing direction of the multiple stages of amplifier circuits as the reference.

It should be noted that in the radio frequency power amplifier provided by the present invention, the current output by the power detection feedback circuit is input into the input ends of the current stage of amplifier circuit and at least one stage of amplifier circuit located prior to the current stage of amplifier circuit, wherein the at least one stage of amplifier circuit includes a condition of any one stage or multiple stages of amplifier circuits, and the at least one stage of amplifier circuit includes a condition of the current stage of amplifier circuit. The current output by the current detection feedback circuit can be input into the input end of at least one stage of amplifier circuit located prior to the certain stage of amplifier circuit, wherein the at least one stage of amplifier circuit includes the condition of any one stage or multiple stages of amplifier circuits, but the at least one stage of amplifier circuit does not include the certain stage of amplifier circuit.

In the radio frequency power amplifier provided by the present invention, each stage of amplifier circuit can consist of a bipolar transistor or a CMOS transistor, and a resistor or an inductor can be arranged between each stage of amplifier circuit and the power supply voltage to be used as a load. A structure and an operating principle of the radio frequency power amplifier provided by the present invention will be illustrated in detail hereafter with reference to FIG. 1-FIG. 5, using two stages of amplifier circuits and three stages of amplifier circuits consisting of the bipolar transistor (called as transistor for short hereafter) and using the inductor as the load of each stage of amplifier circuit.

Embodiment 1

As shown in FIG. 1, the radio frequency power amplifier provided by the present embodiment includes two stages of amplifier circuits, a first bias circuit and a power detection feedback circuit, wherein in the two stages of amplifier circuits, each stage of amplifier circuit uses a common emitter amplifier circuit, i.e., a radio frequency input signal is input into a base of a transistor 101 of a first stage of amplifier circuit through a direct current blocking capacitor. An emitter of the transistor 101 is grounded. An inductor 102, serving as the load of the first stage of amplifier circuit, is connected between a collector of the transistor 101 and the power supply voltage. The output power of the first stage of amplifier circuit respectively enters bases of a transistor 105a, a transistor 105b and a transistor 105c of a second stage of amplifier circuit through the collector of the transistor 101 and a capacitor 103a, a capacitor 103b and a capacitor 103c. Emitters of the transistor 105a, the transistor 105b and the transistor 105c of the second stage of amplifier circuit are jointly grounded. An inductor 106 is used as a load of the second stage of amplifier circuit. One end of the inductor 106 is connected to the power supply voltage, and the other end of the inductor 106 is respectively connected to collectors of the transistor 105a, the transistor 105b and the transistor 105c. The output power of the second stage of amplifier circuit is transmitted to the output end to be output through the direct current blocking capacitor after passing through the collectors of the transistor 105a, the transistor 105b and the transistor 105c.

The first bias circuit includes a transistor 110, a resistor 107, a diode 108 and a diode 109. A collector of the transistor 110 is respectively connected to a bias voltage Vbias and one end of the resistor 107. The other end of the resistor 107 is respectively connected to a base of the transistor 110 and an anode of the triode 108. A cathode of the diode 108 is connected to an anode of the diode 109. A cathode of the diode 109 is grounded. An emitter of the transistor 110 is correspondingly connected to bases of the transistor 105a, the transistor 105b and the transistor 105c respectively through a resistor 104a, a resistor 104b and a resistor 104c. The bias voltage is provided for the transistor 105a, the transistor 105b and the transistor 105c of the second stage of amplifier circuit through the first bias circuit.

According to the power detection feedback circuit of the radio frequency power amplifier provided by the present embodiment, a first resistor 112 and a first capacitor 111 are connected in series between the collector of the transistor 101 of the first stage of amplifier circuit and the base of a first transistor 115 of the power detection feedback circuit, wherein the first resistor 112 and the first capacitor 111 are connected in series to form a first detection circuit. The output power of the first stage of amplifier circuit is detected through the first resistor 112 and the first capacitor 111, and the intensity of the power leaked to the first transistor 115 can be controlled. A fourth resistor 116 and a fifth resistor 117 are correspondingly arranged among the collector of the first transistor 115, the power supply voltage and the base of a second transistor 118. The collector of the second transistor 118 is connected to the power supply voltage. The emitter of the second transistor 118 is connected to the base of the transistor 101 of the first stage of amplifier circuit through a resistor 119. The above-mentioned elements form a first feedback circuit. The bias voltage is provided for the base of the first transistor 115 through a second bias circuit. Concretely, the second bias circuit includes a second resistor 113 and a third resistor 114. One end of the second resistor 113 and one end of the third resistor 114 are connected together to be used as the output end of the second bias circuit. The output end is connected to the base of the first transistor 115. The other end of the second resistor 113 is connected to the power supply voltage. The other end of the third resistor is grounded. The second resistor 113 and the third resistor 114 provide the bias voltage for the first transistor 115 through voltage dividing effects.

When the radio frequency power amplifier has input power, the output power of the transistor 101 of the first stage of amplifier circuit is leaked to the base of the first transistor 115 through the first resistor 112 and the first capacitor 111, so that the operating current of the first transistor 115 is varied. For example, when the output power of the first stage of amplifier circuit increases, the power leaked to the first transistor 115 through the first resistor 112 and the first capacitor 111 correspondingly increases, so that the operating current of the first transistor 115 correspondingly increases. At the moment, the control voltage on the fourth resistor 116 connected to the collector of the first transistor 115 can increase, and the base voltage of the first transistor 115 decreases through the fifth resistor 117, so that the current flowing through the first transistor 115 is controlled to correspondingly decrease. The current output by the second transistor 118 is input into the base of the transistor 101 of the first stage of amplifier circuit by the resistor 119, thereby decreasing the quiescent operating current of the transistor 101 of the first stage of amplifier circuit, so that the gain of the first stage of amplifier circuit decreases, and the output power of the first stage of amplifier circuit decreases.

Embodiment 2

Figure 2:
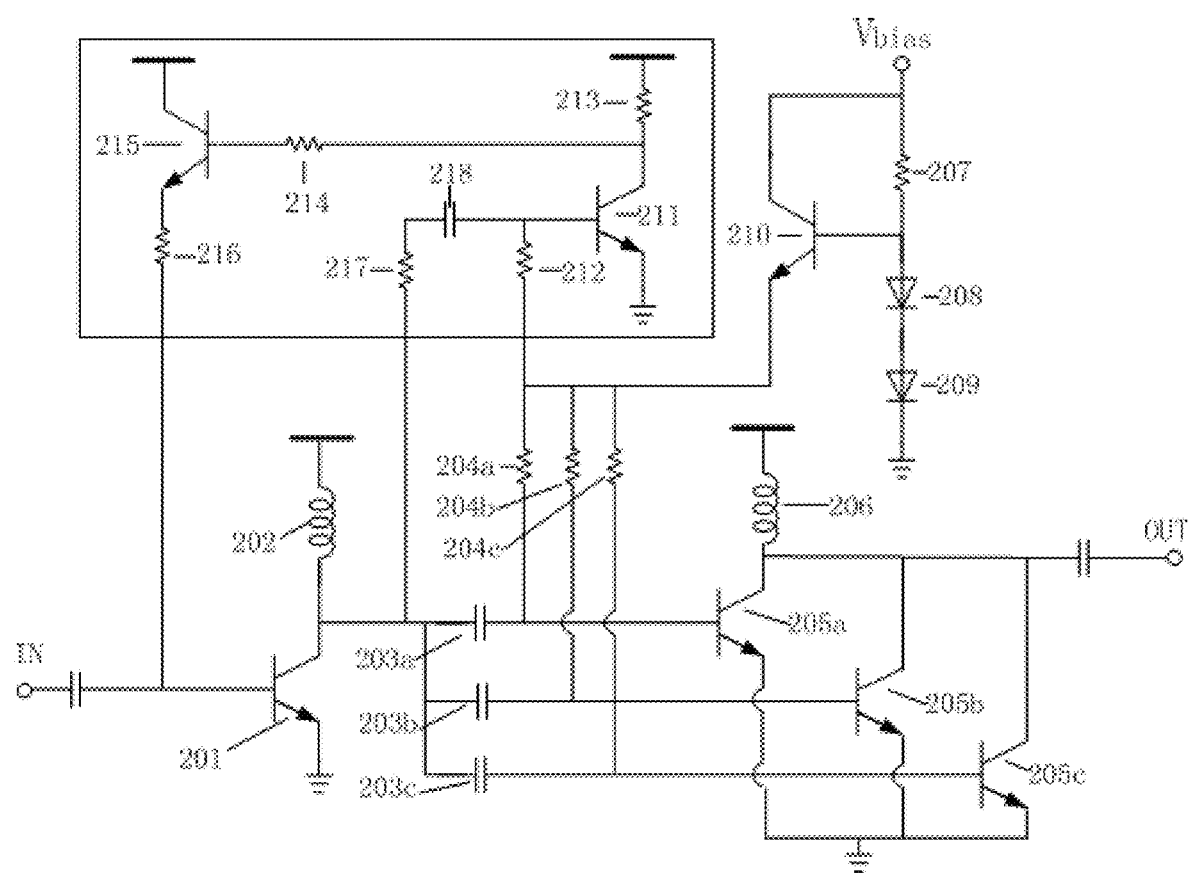
FIG. 2 is a circuit schematic diagram of a radio frequency power amplifier based on power detection feedback provided by Embodiment 2 of the present invention.

As shown in FIG. 2, the radio frequency power amplifier provided by the present embodiment includes two stages of amplifier circuits, a first bias circuit, a power detection feedback circuit and a current detection feedback circuit, wherein in the two stages of amplifier circuits, a first stage of amplifier circuit includes a transistor 201 and an inductor 202; a second stage of amplifier circuit includes a transistor 205a, a transistor 205b, a transistor 205c and an inductor 206; the first bias circuit includes a transistor 210, a resistor 207, a diode 208 and a diode 209; the structures of the first stage of amplifier circuit, the second stage of amplifier circuit and the first bias circuit are identical to those in Embodiment 1, and are not repeated herein. Similarly, the output power of the first stage of amplifier circuit respectively enters the bases of the transistor 205a, the transistor 205b and the transistor 205c of the second stage of amplifier circuit through a collector of the transistor 201, a capacitor 203a, a capacitor 203b and a capacitor 203c. An emitter of the transistor 210 of the first bias circuit is correspondingly connected to bases of the transistor 205a, the transistor 205b and the transistor 205c respectively through a resistor 204a, a resistor 204b and a resistor 204c, and a bias voltage is provided for the transistor 205a, the transistor 205b and the transistor 205c of the second stage of amplifier circuit.

In the power detection feedback circuit provided by the present embodiment, the base of the transistor 211 (the transistor 211 equals to the first transistor 115 in Embodiment 1) is sequentially connected to a capacitor 218 and a resistor 217. The resistor 217 and the capacitor 218 are connected in series between the collector of the transistor 201 and the base of the transistor 211 of the first stage of amplifier circuit. The output power of the first stage of amplifier circuit is detected through the resistor 217 and the capacitor 218, and the intensity of the power leaked into the transistor 211 can be controlled, wherein the resistor 217 equals to the first resistor 112 in Embodiment 1, and the capacitor 218 equals to the first capacitor 111 in Embodiment 1, namely the resistor 217 and the capacitor 218 are connected in series to form the first detection circuit. When the radio frequency power amplifier based on power detection feedback has input power, the output power of the transistor 201 of the first stage of amplifier circuit will be leaked to the base of the transistor 211 through the resistor 217 and the capacitor 218. For example, when the output power of the first stage of amplifier circuit increases, the power leaked to the transistor 211 through the resistor 217 and the capacitor 218 correspondingly increase, so that the operating current of the transistor 211 also correspondingly increases. At the moment, the control voltage on a resistor 213 (the resistor 213 equals to the fourth resistor 116 in Embodiment 1) connected to the collector of the transistor 211 can also increase. The voltage of the base of a transistor 215 decreases through a resistor 214 (the resistor 214 equals to the fifth resistor 117 in Embodiment 1), so that the current flowing through the transistor 215 also correspondingly decreases. A current output from the transistor 215 is input into the base of the transistor 201 of the first stage of amplifier circuit through a resistor 216, thereby decreasing the quiescent operating current of the transistor 201 of the first stage of amplifier circuit, so that the gain of the first stage of amplifier circuit decreases, and the output power of the first stage of amplifier circuit decreases. It should be noted that the transistor 211, the transistor 215, the resistor 213 and the resistor 214 also form a first feedback circuit, and the connection relationship is identical to that in Embodiment 1.

The base of the transistor 211 of the power detection feedback circuit of the radio frequency power amplifier provided by the present embodiment is connected to one end of a sixth resistor 212 (the sixth resistor forms the second detection circuit) to form a current detection feedback circuit. The other end of the sixth resistor 212 is respectively connected to the emitter of the transistor 210 of the first bias circuit, the resistor 204a, the resistor 204b and the resistor 204c, the bias voltage is provided for the transistor 211 through the first bias circuit, and the other end of the sixth resistor 212 is respectively connected to the bases of the transistor 205a, the transistor 205b and the transistor 205c of the second stage of amplifier circuit through the resistor 204a, the resistor 204b and the resistor 204c. The sixth resistor 212 and the transistor 211 form a mirror image of the resistor 204a, the resistor 204b, the resistor 204c and the transistor 205a, the transistor 205b, the transistor 205c. By designing the proportion of the sixth resistor 212 to the resistor 204a, the resistor 204b and the resistor 204c and the proportion of the transistor 211 to the transistor 205a, the transistor 205b and the transistor 205c, the transistor 211 can proportionally copy the quiescent operating currents of the transistor 205a, the transistor 205b and the transistor 205c. When the quiescent operating currents of the transistor 205a, the transistor 205b and the transistor 205c decrease for certain reasons (such as variation of the production process), the gain of the radio frequency power amplifier based on power detection feedback correspondingly decreases. At the moment, the quiescent operating currents of the transistor 205a, the transistor 205b and the transistor 205c copied on the transistor 211 of the current detection feedback circuit correspondingly decreases, so that the control voltage on the resistor 213 connected to the collector of the transistor 211 decreases. The control voltage of the base of the transistor 215 increases through the resistor 214, so that the current flowing through the transistor 215 is controlled to correspondingly increase. The current output by the transistor 215 is input into the base of the transistor 201 of the first stage of amplifier circuit through the resistor 216, so that the quiescent operating current of the transistor 201 of the first stage of amplifier circuit increases. The quiescent operating current on the first stage of amplifier circuit increases, and the gain of the radio frequency power amplifier based on power detection feedback correspondingly increases, thereby solving the problem of gain decrease of the radio frequency power amplifier based on power detection feedback caused by a decrease in the quiescent operating current of the second stage of amplifier circuit, and ensuring the total gain constancy of the radio frequency power amplifier based on power detection feedback.

Therefore, the radio frequency power amplifier based on power detection feedback provided by the present embodiment can detect the output power of the first stage of amplifier circuit through the power defection feedback circuit, and can control the quiescent current of the first stage of amplifier circuit according to the detected output power of the first stage of amplifier circuit. The quiescent operating current of the input end of the second stage of amplifier circuit can be detected through the current detection feedback circuit, and the quiescent operating current of the first stage of amplifier circuit is controlled according to the detected quiescent operating current of the second stage of amplifier circuit, so that the radio frequency power amplifier operates in a state in which the gain and the output power are stable.

Embodiment 3

Figure 3:
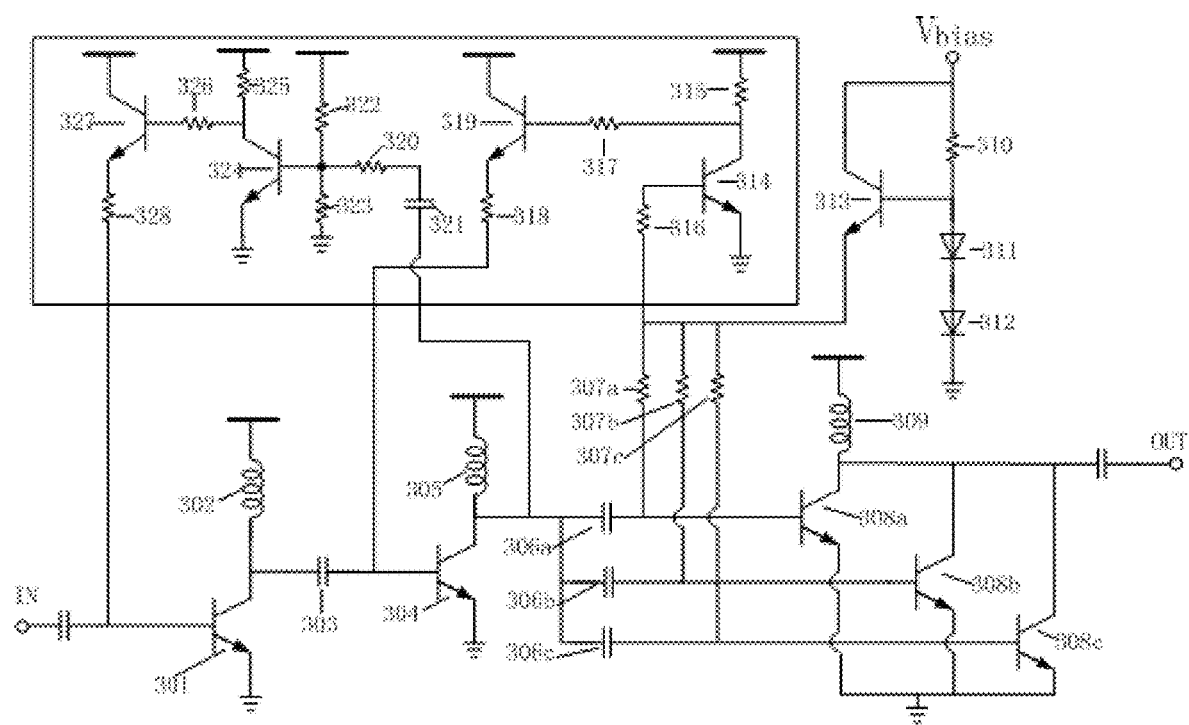
FIG. 3 is a circuit schematic diagram of a radio frequency power amplifier based on power detection feedback provided by Embodiment 3 of the present invention.

As shown in FIG. 3, the radio frequency power amplifier provided by the present embodiment includes three stages of amplifier circuits, a first bias circuit, a current detection feedback circuit and a power detection feedback circuit In the three stages of amplifier circuits, a first stage of amplifier circuit includes a transistor 301 and an inductor 302; a second stage of amplifier circuit includes a transistor 304 and an inductor 305; and a third stage of amplifier circuit includes a transistor 308a, a transistor 308b, a transistor 308c and an inductor 309. The first bias circuit includes a transistor 313, a resistor 310, a diode 311 and a diode 312. The structures of the first stage of amplifier circuit and the second stage of amplifier circuit are identical to the structure of the first stage of amplifier circuit in Embodiment 1, the structure of the third stage of amplifier circuit is identical to the structure of the second stage of amplifier circuit in Embodiment 1, and the structures are not repeated herein. The structure of the first bias circuit is identical to the structure of the first bias circuit in Embodiment 1, and is not repeated herein. Similarly, the output power of the first stage of amplifier circuit enters a base of the transistor 304 of the second stage of amplifier circuit through a collector of the transistor 301 and the capacitor 303. The output power of the second stage of amplifier circuit respectively enters bases of the transistor 308a, the transistor 308b and the transistor 308c through a collector of the transistor 304 and a capacitor 306a, a capacitor 306b and a capacitor 306c. An emitter of the transistor 313 of the first bias circuit is correspondingly connected to bases of the transistor 308a, the transistor 308b and the transistor 308c respectively through a resistor 307a, a resistor 307b and a resistor 307c, and the bias voltage is provided for the transistor 308a, the transistor 308b and the transistor 308c of the third stage of amplifier circuit.

In the radio frequency power amplifier provided by the present embodiment, the power detection feedback circuit connects a resistor 320 and a capacitor 321 in series (for forming the first detection circuit) between the collector of the transistor 304 of the second stage of amplifier circuit and the base of a transistor 324 of the power detection feedback circuit, the output power of the second stage of amplifier circuit is detected through the resistor 320 and the capacitor 321, and the intensity of the power leaked to the transistor 324 can be controlled. The base of the transistor 324 is respectively connected to one end of a resistor 322 and one end of a resistor 323 (forming the second bias circuit), the other end of the resistor 322 is connected to the power supply voltage, and the other end of the resistor 323 is grounded. The resistor 322 and the resistor 323 provide the bias voltage for the transistor 324 through the voltage dividing effect. A resistor 325 and a resistor 326 are correspondingly arranged among the collector of the transistor 324, the power supply voltage and the base of a transistor 327. The collector of the transistor 327 is connected to the power supply voltage. The emitter of the transistor 327 is connected to the base of the transistor 301 of the first stage of amplifier circuit through a resistor 328. Additionally, the transistor 324, the transistor 327, the resistor 325 and the resistor 326 form the first feedback circuit, wherein the resistor 320 equals to the first resistor 112 in Embodiment 1, the capacitor 321 equals to the first capacitor 111 in Embodiment 1, the transistor 324 equals to the first transistor 115 in Embodiment 1, the resistor 322 equals to the second resistor 113 in Embodiment 1, the resistor 323 equals to the third resistor 114 in Embodiment 1, the resistor 325 equals to the fourth resistor 116 in Embodiment 1, the resistor 326 equals to the fifth resistor 117 in Embodiment 1, and the transistor 327 equals to the second transistor 118 in Embodiment 1. When the radio frequency power amplifier based on power detection feedback has the input power, the output power of the transistor 304 of the second stage of amplifier circuit will be leaked to the base of the transistor 324 through the resistor 320 and the capacitor 321, so that the operating current of the transistor 324 is varied. The resistor 325 generates a corresponding control voltage according to the operating current fed back by the collector of the transistor 324, the current flowing through the transistor 327 is controlled through the resistor 326, the current of the output end of the transistor 327 is input into the base of the transistor 301 of the first stage of amplifier circuit through the resistor 328, thereby controlling the quiescent operating current of the first stage of amplifier circuit, and ensuring the radio frequency power amplifier based on power detection feedback to operate in a state in which the gain and the output power are stable.

In the current detection feedback circuit of the radio frequency power amplifier provided by the present embodiment, a transistor 314, a transistor 319, a resistor 315 and a resistor 317 form the second feedback circuit, wherein the connection relationship among all elements in the second feedback circuit is identical to that of the first feedback circuit in Embodiment 1, and is not repeated herein. The resistor 316 equals to the sixth resistor in Embodiment 2, and identically forms the second detection circuit. The base of the transistor 314 is respectively connected to a resistor 307a, a resistor 307b and a resistor 307c through the resistor 316. The collector of the transistor 319 is connected to the power supply voltage. The emitter of the transistor 319 is connected to the base of the transistor 304 through the resistor 318. Similarly, the resistor 316 and the transistor 314 form the mirror image of the resistor 307a, the resistor 307b, the resistor 307c and the transistor 308a, the transistor 308b, the transistor 308c, the transistor 314 can proportionally copy the quiescent operating currents of the transistor 308a, the transistor 308b and the transistor 308c by designing the proportion of the resistor 316 to the resistor 307a, the resistor 307b and the resistor 307c and the proportion of the transistor 314 to the transistor 308a, the transistor 308b and the transistor 308c. The radio frequency power amplifier can detect the quiescent operating current of the input end of the third stage of amplifier circuit through the resistor 316 (the second detection circuit), and can feed back the result to the resistor 315 through the collector of the transistor 314 after the quiescent operating current is copied through the transistor 314. The resistor 315 generates the corresponding control voltage according to the quiescent operating current, the current flowing through the transistor 319 is controlled through the resistor 317, different current flowing through the transistor 319 is input into the input end of the second stage of amplifier circuit through the resistor 318, thereby controlling the quiescent operating current of the second stage of amplifier circuit, and ensuring the second stage of amplifier circuit to operate in a state in which the gain is stable.

Therefore, the radio frequency power amplifier provided by the present embodiment can detect the output power of the second stage of amplifier circuit through the power detection feedback circuit, and can control the quiescent current of the first stage of amplifier circuit according to the detected output power of the second stage of amplifier circuit. The quiescent operating current of the input end of the third stage of amplifier circuit can also be detected through the current detection feedback circuit, and the quiescent operating current of the second stage of amplifier circuit is controlled according to the detected quiescent operating current of the input end of the third stage of amplifier circuit, so that the radio frequency power amplifier based on power detection feedback operates in a state in which the gain and the output power are stable.

Embodiment 4

Figure 4:
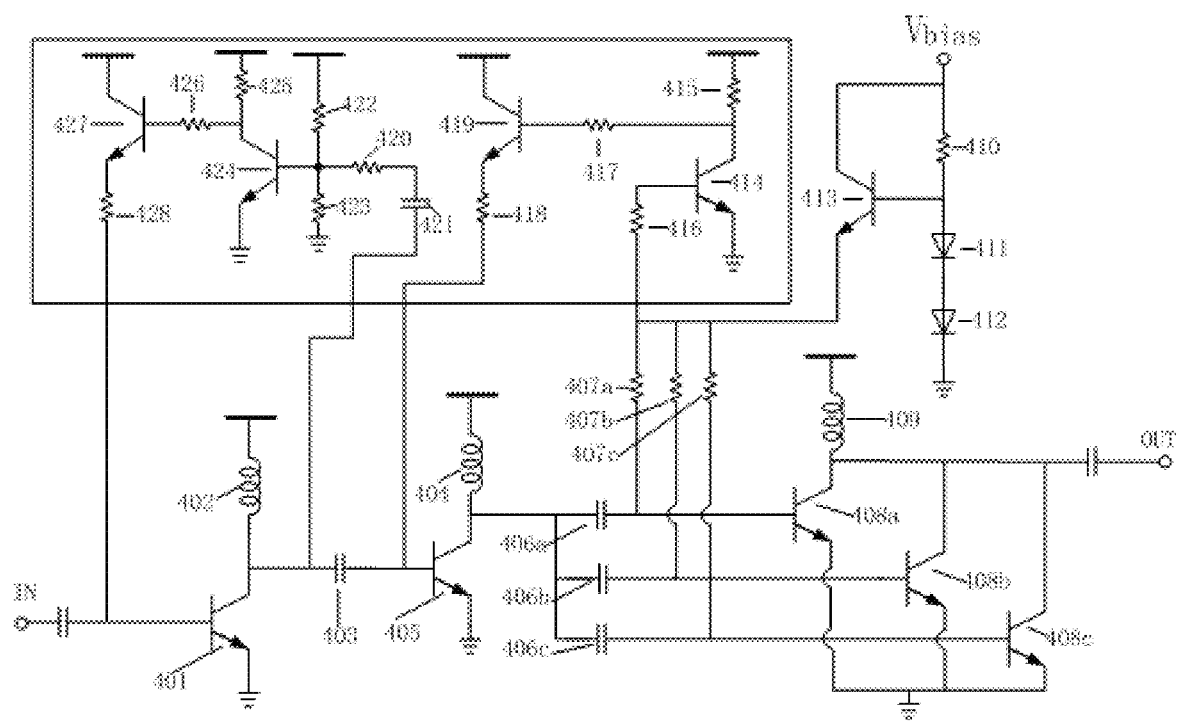
FIG. 4 is a circuit schematic diagram of a radio frequency power amplifier based on power detection feedback provided by Embodiment 4 of the present invention.

As shown in FIG. 4, the radio frequency power amplifier provided by the present embodiment includes three stages of amplifier circuits, a first bias circuit, a current detection feedback circuit and a power detection feedback circuit. In the three stage of amplifier circuits, a first stage of amplifier circuit includes a transistor 401 and an inductor 402; a second stage of amplifier circuit includes a transistor 405 and an inductor 404; and a third stage of amplifier circuit includes a transistor 408a, a transistor 408b, a transistor 408c and an inductor 409. The first bias circuit includes a transistor 413, a resistor 410, a diode 411 and a diode 412. The structures of the first stage of amplifier circuit, the second stage of amplifier circuit and the third stage of amplifier circuit are identical to the structures of the first stage of amplifier circuit, the second stage of amplifier circuit and the third stage of amplifier circuit in Embodiment 3, the structure of the first bias circuit is identical to the structure of the first bias circuit in Embodiment 1, and are not repeated herein. Similarly, the output power of the first stage of amplifier circuit enters the base of the transistor 405 of the second stage of amplifier circuit through a collector of the transistor 401 and the capacitor 403, the output power of the second stage of amplifier circuit respectively enters bases of the transistor 408a, the transistor 408b and the transistor 408c of the third stage of amplifier circuit through the collector of the transistor 405, a capacitor 406a, a capacitor 406b and a capacitor 406c. The emitter of the transistor 413 of the first bias circuit is respectively connected to the bases of the transistor 408a, the transistor 408b and the transistor 408c through a resistor 407a, a resistor 407b and a resistor 407c, and the bias voltage is provided for the transistor 408a, the transistor 408b and the transistor 408c of the third stage of amplifier circuit.

In the radio frequency power amplifier provided by the present embodiment, the power detection feedback circuit connects a resistor 420 and a capacitor 421 in series (the resistor 420 and the capacitor 421 are connected in series to form the first detection circuit) between the collector of the transistor 401 of the first stage of amplifier circuit and the base of a transistor 424 of the power detection feedback circuit. The output power of the first stage of amplifier circuit is detected through the resistor 420 and the capacitor 421, and the intensity of the power leaked into the transistor 424 can be controlled. The power detection feedback circuit provides the bias voltage for the transistor 424 through the voltage dividing effect of a resistor 422 and a resistor 423 (the resistor 422 and the resistor 423 form the second bias circuit). When the radio frequency power amplifier based on power detection feedback has the input power, the output power of the transistor 401 of the first stage of amplifier circuit will be leaked to the base of the transistor 424 through the resistor 420 and the capacitor 421, so that the operating current of the transistor 424 is varied. A resistor 425 generates the corresponding control voltage according to the operating current fed back by the collector of the transistor 424. The current flowing through a transistor 427 is controlled through a resistor 426, and the current of the output end of the transistor 427 is input into the base of the transistor 401 of the first stage of amplifier circuit through a resistor 428, thereby controlling the quiescent operating current of the first stage of amplifier circuit, and ensuring the radio frequency power amplifier based on power detection feedback to operate in a state in which the gain and the output power are stable.

In the radio frequency power amplifier provided by the present embodiment, the current detection feedback circuit includes a second feedback circuit consisting of a transistor 414, a transistor 419, a resistor 415 and a resistor 417, and also includes a second detection circuit consisting of a resistor 416. The power detection feedback circuit includes a first feedback circuit consisting of the transistor 424, the transistor 427, the resistor 425 and the resistor 426, further includes a second bias circuit consisting of the resistor 422 and the resistor 423, and further includes a first detection circuit consisting of the resistor 420 and the capacitor 421, wherein the structures of the first feedback circuit and the second feedback circuit are identical to the structure of the first feedback circuit in Embodiment 1, the structure of the first detection circuit is identical to that in Embodiment 1, the structure of the second detection circuit is identical to that in Embodiment 2, the structure of the second bias circuit is identical to that in Embodiment 1, and those structures are not repeated herein.

Similarly, the resistor 416 and the transistor 414 form a mirror image of the resistor 407a, the resistor 407b, the resistor 407c and the transistor 408a, the transistor 408b, the transistor 408c. By designing the proportion of the resistor 416 to the resistor 407a, the resistor 407b and the resistor 407c and the proportion of the transistor 414 to the transistor 408a, the transistor 408b and the transistor 408c, the transistor 414 can proportionally copy the quiescent operating currents of the transistor 408a, the transistor 408b and the transistor 408c. The current detection feedback circuit detects the quiescent operating current of the third stage of amplifier circuit through the resistor 416, copies the quiescent operating current through the transistor 414, and then feeds back the result to the resistor 415 through the collector of the transistor 414. The resistor 415 generates the corresponding control voltage according to the quiescent operating current, and controls the current flowing through the transistor 419 through the resistor 417. Different current flowing through the transistor 419 is input into the second stage of amplifier circuit through the resistor 418, thereby controlling the quiescent operating current of the second stage of amplifier circuit, and ensuring the second stage of amplifier circuit to operate in a state in which the gain is stable.

Therefore, the radio frequency power amplifier provided by the present embodiment can detect the output power of the first stage of amplifier circuit through the power detection feedback circuit, and controls the quiescent current of the first stage of amplifier circuit according to the detected output power of the first stage of amplifier circuit. The radio frequency power amplifier provided by the present embodiment can also detect the quiescent operating current of the input end of the third stage of amplifier circuit through the current detection feedback circuit, and controls the quiescent operating current of the second stage of amplifier circuit according to the detected quiescent operating current of the third stage of amplifier circuit, so that the radio frequency power amplifier based on power detection feedback operates in a state in which the gain and the output power are stable.

Embodiment 5

Figure 5:
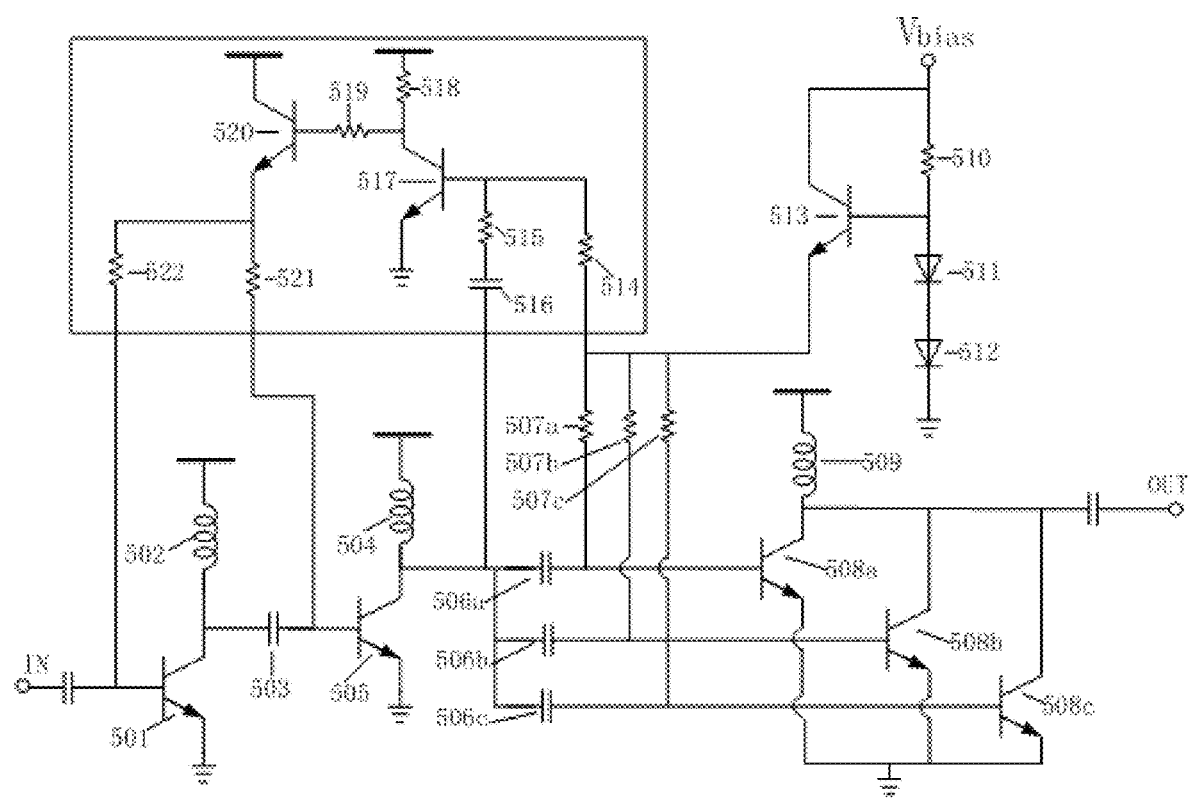
FIG. 5 is a circuit schematic diagram of a radio frequency power amplifier based on power detection feedback provided by Embodiment 5 of the present invention.

As shown in FIG. 5, the radio frequency power amplifier provided by the present embodiment includes three stages of amplifier circuits, a first bias circuit, a current detection feedback circuit and a power detection feedback circuit. In the three stages of amplifier circuits, a first stage of amplifier circuit includes a transistor 501 and an inductor 502; a second stage of amplifier circuit includes a transistor 505 and an inductor 504; and a third stage of amplifier circuit includes a transistor 508a, a transistor 508b, a transistor 508c and an inductor 509. The first bias circuit includes a transistor 513, a resistor 510, a diode 511 and a diode 512. The structures of the first stage of amplifier circuit, the second stage of amplifier circuit and the third stage of amplifier circuit are identical to the structures of the first stage of amplifier circuit, the second stage of amplifier circuit and the third stage of amplifier circuit in Embodiment 3, the structure of the first bias circuit is identical to the structure of the first bias circuit in Embodiment 1, and are not repeated herein. Similarly, the output power of the first stage of amplifier circuit enters a base of the transistor 505 of the second stage of amplifier circuit through a collector of the transistor 501 and a capacitor 503, the output power of the second stage of amplifier circuit respectively enters bases of the transistor 508a, the transistor 508b and the transistor 508c of the third stage of amplifier circuit through the collector of the transistor 505, a capacitor 506a, a capacitor 506b and a capacitor 506c. An emitter of the transistor 513 of the first bias circuit is correspondingly and respectively connected to the bases of the transistor 508a, the transistor 508b and the transistor 508b through a resistor 507a, a resistor 507b and a resistor 507c, and the bias voltage is provided for the transistor 508a, the transistor 508b and the transistor 508c of the third stage of amplifier circuit.

In the power detection feedback circuit provided by the present embodiment, the base of a transistor 517 (the transistor 517 equals to the first transistor 115 in Embodiment 1) is sequentially connected to a resistor 515 and a capacitor 516, and the resistor 515 and the capacitor 516 are connected in series between the collector of the transistor 505 of the second stage of amplifier circuit and the base of the transistor 517. The output power of the second stage of amplifier circuit is detected through the resistor 515 and the capacitor 516, and the intensity of the power leaked to the transistor 517 can be controlled, wherein the resistor 515 equals to the first resistor 112 in Embodiment 1, and the capacitor 516 equals to the first capacitor 111 in Embodiment 1. When the radio frequency power amplifier based on power detection feedback has the input power, the output power of the transistor 505 of the second stage of amplifier circuit will be leaked to the base of the transistor 517 through the resistor 515 and the capacitor 516, so that the operating current of the transistor 517 is varied. A resistor 518 (equals to the fourth resistor 116 in Embodiment 1) generates the corresponding control voltage according to the operating current fed back by the collector of the transistor 517. The current flowing through a transistor 520 (equals to the second transistor 118 in Embodiment 1) is controlled through a resistor 519 (equals to the fifth resistor 117 in Embodiment 1), the current of the output end of the transistor 520 is respectively input to the base of the transistor 501 of the first stage of amplifier circuit and the base of the transistor 505 of the second stage of amplifier circuit through a resistor 521 and a resistor 522, thereby controlling the quiescent operating current of the first stage of amplifier circuit and the second stage of amplifier circuit, and ensuring the radio frequency power amplifier based on power detection feedback to operate in a state in which the gain and the output power are stable.

Therefore, the radio frequency power amplifier provided by the present embodiment can detect the output power of the second stage of amplifier circuit through the power detection feedback circuit, and respectively controls the quiescent current of the first stage of amplifier circuit and the second stage of amplifier circuit according to the detected output power of the second stage of amplifier circuit. The radio frequency power amplifier provided by the present embodiment can also detect the quiescent operating current of the input end of the third stage of amplifier circuit through the current detection feedback circuit, and respectively controls the quiescent operating current of the first stage of amplifier circuit and the second stage of amplifier circuit according to the detected quiescent operating current of the third stage of amplifier circuit, so that the radio frequency power amplifier based on power detection feedback operates in a state in which the gain and the output power are stable.

A resistor 514 (equals to the sixth resistor 212 in Embodiment 2) is connected to the base of the transistor 517 of the power detection feedback circuit provided by the present embodiment, and a current detection feedback circuit is formed. Compared with the current detection feedback circuit in Embodiment 2, the structure of the current detection feedback circuit provided by the present embodiment is characterized in that the current detection feedback circuit uses the resistor 521 and the resistor 522 for correspondingly connecting the base of the transistor 505 of the second stage of amplifier circuit and the base of the transistor 501 of the first stage of amplifier circuit, the current output by the transistor 520 is respectively input into the first stage of amplifier circuit and the second stage of amplifier circuit, thereby controlling the quiescent operating current of the first stage of amplifier circuit and the second stage of amplifier circuit. Concretely, the current detection feedback circuit detects the quiescent operating current of the third stage of amplifier circuit through the resistor 514, copies the quiescent operating current through the transistor 517 and then feeds back the result to the resistor 518 through the collector of the transistor 517. The resistor 518 generates a corresponding control voltage according to the quiescent operating current, and controls the current flowing through the transistor 520 through the resistor 519, different current flowing through the transistor 520 is respectively input into the first stage of amplifier circuit and the second stage of amplifier circuit through the resistor 521 and the resistor 522, thereby controlling the quiescent operating currents of the first stage of amplifier circuit and the second stage of amplifier circuit, and ensuring the radio frequency power amplifier based on power detection feedback to operate in a state in which the gain is stable.

In the radio frequency power amplifier provided by the present invention, the power detection feedback circuit can also use a capacitor to replace a structure of connecting a capacitor and a resistor in series to be connected between the output end of the current stage of amplifier circuit and the input end of the power detection feedback circuit, and the output power of the current stage of amplifier circuit is detected through the capacitor. The operating principle of the power detection feedback circuit is as mentioned above and is not repeated herein. It should be noted that the transistors in the first bias circuit, the power detection feedback circuit and the current detection feedback circuit in the radio frequency power amplifier provided by the present invention are bipolar transistors.

The radio frequency power amplifier provided by the present invention can connect the input end of the power detection feedback circuit to the output end of the current stage of amplifier circuit of the radio frequency power amplifier based on power detection feedback, and can also connect the input end of a certain stage of amplifier circuit located posterior to the current stage of amplifier circuit connected to the power detection feedback circuit to the input end of the current detection feedback circuit after connecting the input end of the power detection feedback circuit to the output end of the current stage of amplifier circuit of the radio frequency power amplifier based on power detection feedback. The radio frequency power amplifier achieves the following effects that:

1. The power detection feedback circuit generates, according to the detected output power of the current stage of amplifier circuit, the control voltage varying reversely with the output power so that the power detection feedback circuit outputs a current varying positively with the control voltage.

2. The current output by the power detection feedback circuit is input to the input end of at least one stage of amplifier circuit (including the current stage of amplifier circuit) located prior to the current stage of amplifier circuit, so that the gain and the output power of the at least one stage of amplifier circuit located prior to the current stage of amplifier circuit vary positively with the current output by the power detection feedback circuit, and the problem of gain and output power increase or decrease of the radio frequency power amplifier caused by output power increase or decrease of the current stage of amplifier circuit can be solved.

3. The current detection feedback circuit generates, according to the detected quiescent operating current of the input end of the certain stage of amplifier circuit, the control voltage varying inversely with the quiescent operating current, so that the current detection feedback circuit outputs the current varying positively with the control voltage.

4. The current output by the current detection feedback circuit is input into the input end of at least one stage of amplifier circuit located prior to the certain stage of amplifier circuit, so that the gain of the at least one stage of amplifier circuit located prior to the certain stage of amplifier circuit varies positively with the current output by the current detection feedback circuit, so that the problem of gain increase or decrease of the radio frequency power amplifier caused by an increase or decrease in the quiescent operating current of the certain stage of amplifier circuit can be solved.

Based on the above, the radio frequency power amplifier can effectively inhibit the operating state variation of the radio frequency power amplifier caused by the process variation, and can reduce the influence of the variation of an input signal on the operating state of the radio frequency power amplifier, so that the radio frequency power amplifier operates in a state in which the gain and the output power are stable.

The radio frequency power amplifier provided by the present invention can be used in a radio frequency chip. Concrete structures of the radio frequency power amplifier based on power detection feedback in the radio frequency chip are not illuminated one by one in detail herein.

Additionally, the radio frequency power amplifier based on power detection feedback can also be used in a communication terminal to be used as an important composition part of a radio frequency integrated circuit. The communication terminal mentioned herein refers to computer equipment capable of being used in a mobile environment and supporting various communication systems such as GSM, EDGE, TD_SCDMA, TDD_LTE and FDD_LTE, including a mobile phone, a notebook computer, a tablet personnel computer, a car computer, etc. In addition, the technical scheme provided by the present invention is also applicable to other occasions of radio frequency integrated circuit application, such as communication base stations.

The radio frequency power amplifier, the chip and the communication terminal provided in the present invention have been described in detail above. Any obvious modification made by those of ordinary skill in the art to the present invention without departing from the essential of the present invention shall all fall within the protection scope of the present invention.

What is claimed is:

1. A radio frequency power amplifier based on power detection feedback, comprising multiple stages of amplifier circuits and at least one power detection feedback circuit, wherein an input end of the power detection feedback circuit is connected to an output end of a current stage of amplifier circuit in the multiple stages of amplifier circuits, an output end of the power detection feedback circuit is connected to input ends of the current stage of amplifier circuit and at least one stage of amplifier circuit located prior to the current stage of amplifier circuit; and the power detection feedback circuit generates, according to the detected output power of the current stage of amplifier circuit, a control voltage varying inversely with the output power, so that the power detection feedback circuit outputs a current varying positively with the control voltage; the current is input into the input ends of the current stage of amplifier circuit and the at least one stage of amplifier circuit located prior to the current stage of amplifier circuit, so that a quiescent operating current of at least one stage of amplifier circuit varies positively with the current; and the radio frequency power amplifier operates in a state in which the gain and the output power are stable.

2. The radio frequency power amplifier based on power detection feedback according to claim 1, wherein the radio frequency power amplifier further comprises at least one current detection feedback circuit, wherein an input end of the current detection feedback circuit is connected to an input end of a certain stage of amplifier circuit located posterior to the current stage of amplifier circuit through a corresponding resistor; an output end of the current detection feedback circuit is connected to an input end of at least one stage of amplifier circuit located prior to the current stage of amplifier circuit; and the current detection feedback circuit generates, according to a detected quiescent operating current of the current stage of amplifier circuit, a control voltage varying inversely with the quiescent operating current, so that the current detection feedback circuit outputs a current varying positively with the control voltage; the current is input into the input end of the at least one stage of amplifier circuit located prior to the current stage of amplifier circuit, so that the quiescent operating current of the at least one stage of amplifier circuit varies positively with the current; and the radio frequency power amplifier operates in a state in which the gain and the output power are stable.

3. The radio frequency power amplifier based on power detection feedback according to claim 1, wherein the power detection feedback circuit comprises a first detection circuit and a first feedback circuit, wherein an output end of the first detection circuit is connected to an input end of the first feedback circuit, an input end of the first detection circuit is connected to the output end of the current stage of amplifier circuit, and an output end of the first feedback circuit is connected to the input ends of the current stage of amplifier circuit and the at least one stage of amplifier circuit located prior to the current stage of amplifier circuit.

4. The radio frequency power amplifier based on power detection feedback according to claim 3, wherein the input end of the first feedback circuit is connected to an output end of a second detection circuit, and the detected quiescent operating current of the current stage of amplifier circuit is input into the first feedback circuit through the second detection circuit.

5. The radio frequency power amplifier based on power detection feedback according to claim 2, wherein the current detection feedback circuit comprises a second detection circuit and a second feedback circuit, wherein an output end of the second detection circuit is connected to an input end of the second feedback circuit, an input end of the second detection circuit is connected to the input end of the current stage of amplifier circuit, and an output end of the second feedback circuit is connected to the input end of the at least one stage of amplifier circuit located prior to the current stage of amplifier circuit.

6. The radio frequency power amplifier based on power detection feedback according to claim 4, wherein the first detection circuit is formed by connecting a first resistor and a first capacitor in series, and the second detection circuit consists of a sixth resistor.

7. The radio frequency power amplifier based on power detection feedback according to claim 4, wherein the first detection circuit consists of a first capacitor.

8. The radio frequency power amplifier based on power detection feedback according to claim 4, wherein each of the first feedback circuit and the second feedback circuit comprises two transistors, a fourth resistor is arranged between a collector of a first transistor and a power supply voltage, a fifth resistor is arranged between the collector of the first transistor and a base of a second transistor, a collector of the second transistor is connected to the power supply voltage, a base of the first transistor is used as the input end of the feedback circuit, and an emitter of the second transistor is used as the output end of the feedback circuit.

9. The radio frequency power amplifier based on power detection feedback according to claim 4, wherein when the current detection feedback circuit and the power detection feedback circuit share the first feedback circuit, a bias voltage is respectively provided for the current stage of amplifier circuit and a first transistor through a first bias circuit, the first bias circuit comprises a transistor, a collector of the transistor is connected to the bias voltage, an emitter of the transistor is connected to a base of the first transistor through a sixth resistor, the emitter of the transistor is connected to the input end of the current stage of amplifier circuit, a resistor is arranged between the base of the transistor and the bias voltage, and two diodes are connected in series between the base of the transistor and a ground wire.

10. The radio frequency power amplifier based on power detection feedback according to claim 3, wherein a bias voltage is provided for a first transistor of the power detection feedback circuit through a second bias circuit, the second bias circuit comprises a second resistor and a third resistor, one end of the second resistor is connected to a power supply voltage, the other end of the second resistor and one end of the third resistor are connected together to form the output end of the second bias circuit, and the other end of the third resistor is grounded.

11. The radio frequency power amplifier based on power detection feedback according to claim 5, wherein
a bias voltage is respectively provided for a first transistor of the current detection feedback circuit and the current stage of amplifier circuit through a first bias circuit.

12. The radio frequency power amplifier based on power detection feedback according to claim 1, wherein
in the multiple stages of amplifier circuits, each stage of amplifier circuit is a common emitter amplifier circuit consisting of a bipolar transistor or a CMOS transistor, a load is arranged between each stage of amplifier circuit and a power supply voltage, the load is a resistor or an inductor, and a capacitor is arranged between an input end of a posterior stage of amplifier circuit and an output end of a prior stage of amplifier circuit.

13. A chip, comprising the radio frequency power amplifier based on power detection feedback according to claim 1.

14. A communication terminal, comprising the radio frequency power amplifier based on power detection feedback according to claim 1.

* * * * *